(12) United States Patent
Stranford et al.

(10) Patent No.: US 10,888,897 B2
(45) Date of Patent: Jan. 12, 2021

(54) TRANSDUCER, TRANSDUCER ARRAY, AND METHOD OF MAKING THE SAME

(71) Applicant: CTS Corporation, Lisle, IL (US)

(72) Inventors: Gerald T. Stranford, Albuquerque, NM (US); Marshall Suarez, Albuquerque, NM (US)

(73) Assignee: CTS Corporation, Lisle, IL (US)

( * ) Notice: Subject to any disclaimer, the term of this patent is extended or adjusted under 35 U.S.C. 154(b) by 446 days.

(21) Appl. No.: 15/794,557

(22) Filed: Oct. 26, 2017

(65) Prior Publication Data

US 2018/0117631 A1 May 3, 2018

Related U.S. Application Data

(60) Provisional application No. 62/413,865, filed on Oct. 27, 2016.

(51) Int. Cl.
*B06B 1/06* (2006.01)
*H01L 41/047* (2006.01)
(Continued)

(52) U.S. Cl.
CPC ............ *B06B 1/0603* (2013.01); *H01L 27/20* (2013.01); *H01L 41/0474* (2013.01);
(Continued)

(58) Field of Classification Search
CPC combination set(s) only.
See application file for complete search history.

(56) References Cited

U.S. PATENT DOCUMENTS

| 5,854,846 A | 12/1998 | Beavers et al. |
| 6,291,927 B1 | 9/2001 | Percin et al. |

(Continued)

FOREIGN PATENT DOCUMENTS

| WO | 2015/171224 A1 | 11/2015 |
| WO | 2016/007250 A1 | 1/2016 |
| WO | 2016162829 | 10/2016 |

OTHER PUBLICATIONS

Yongqiang Qiu, Piezoelectric Micromachined Ultrasound Transducer (PMUT) Arrays, Sensors 2015, 15(4), 8020-8041; doi:10.3390/s150408020; http://www.mdpi.com/1424-8220/15/4/8020/htm.

(Continued)

*Primary Examiner* — Bryan P Gordon
(74) *Attorney, Agent, or Firm* — Daniel Deneufbourg (57) ABSTRACT

A transducer comprising a transducer element including a plate with a through-hole and a collar projecting from the plate and defining an interior cavity in communication with the through-hole. A piezoelectric bender includes at least first and second wafer layers stacked together. The bender is coupled to a peripheral end face of the collar. The first and/or second piezoelectric wafer layers bend at a resonant frequency and generate ultrasonic waves that flow through the collar interior cavity and the plate through-hole and create an in-air pressure pattern and acoustic field at a location spaced from the transducer. A plurality of transducers may be made by providing a monolithic transducer element structure including a plurality of the transducer elements formed thereon, coupling either a plurality of benders or a monolithic bender to the plurality of transducer elements, and then cutting the monolithic transducer element structure to define a plurality of individual transducers.

6 Claims, 5 Drawing Sheets

(51) Int. Cl.
*H01L 41/09* (2006.01)
*H01L 41/338* (2013.01)
*H01L 27/20* (2006.01)
*H01L 41/312* (2013.01)

(52) U.S. Cl.
CPC ...... *H01L 41/0926* (2013.01); *H01L 41/0973* (2013.01); *H01L 41/312* (2013.01); *H01L 41/338* (2013.01)

(56) References Cited

U.S. PATENT DOCUMENTS

| | | | |
|---|---|---|---|
| 6,584,660 B1 | 7/2003 | Shimogawa et al. | |
| 6,894,425 B1 | 5/2005 | Solomon et al. | |
| 8,345,513 B2 | 1/2013 | Huang | |
| 8,456,958 B2 | 6/2013 | Felix et al. | |
| 8,600,082 B2 | 12/2013 | Lee et al. | |
| 8,858,447 B2 | 10/2014 | Chung | |
| 9,412,931 B2 | 8/2016 | Shimada et al. | |
| 9,516,428 B2 | 12/2016 | Dehe et al. | |
| 2003/0060172 A1* | 3/2003 | Kuriyama | H05K 1/0206 455/575.1 |
| 2004/0046481 A1 | 3/2004 | Takeuchi et al. | |
| 2007/0220724 A1 | 9/2007 | Ohnishi et al. | |
| 2012/0206544 A1* | 8/2012 | MacHida | B41J 2/1628 347/68 |
| 2014/0232241 A1* | 8/2014 | Hajati | B81B 7/02 310/317 |
| 2015/0028726 A1* | 1/2015 | Kim | H01L 41/083 310/365 |
| 2015/0165479 A1 | 6/2015 | Lasiter et al. | |
| 2015/0192995 A1 | 7/2015 | Subramanian et al. | |
| 2016/0023244 A1* | 1/2016 | Zhuang | B81B 3/0037 310/300 |
| 2016/0027991 A1* | 1/2016 | Suzuki | H01L 27/20 600/447 |
| 2016/0256133 A1 | 9/2016 | Dekker et al. | |
| 2016/0315247 A1* | 10/2016 | Boser | H01L 41/083 |
| 2017/0110504 A1 | 4/2017 | Panchawagh et al. | |

OTHER PUBLICATIONS

Muhammed SabriSalim, Capacitive Micromachined Ultrasonic Transducers; Journal of Medical Ultrasound, vol. 20, Issue 1, Mar. 2012, pp. 8-31; http://www.sciencedirect.com/science/article/pii/S0929644112000094.

* cited by examiner

TRANSDUCER, TRANSDUCER ARRAY, AND METHOD OF MAKING THE SAME

CROSS-REFERENCE TO RELATED APPLICATION

This patent application claims priority and benefit of the filing date of U.S. Provisional Patent Application Ser. No. 62/413,865 filed on Oct. 27, 2017, the disclosure and contents of which are expressly incorporated herein in its entirety by reference.

TECHNICAL FIELD

This invention relates to generally to a transducer, an array of transducers, and a method of making the same.

BACKGROUND OF THE INVENTION

Tactile sensations on human skin can be created by using a phased array of ultrasonic transducers arranged to generate a predetermined distribution of in-air pressure patterns and create an in-air acoustic field adapted to provide an in-air tactile sensation on human skin.

An example of one such transducer array that is adaptable for providing tactile feedback and sensation to the fingers of a user above the surface of a vehicle display or the like is disclosed in United States Patent Application Publication No. US 2015/0192995 A1.

The present invention is directed to a new ultrasonic transducer and array of transducers for use in, for example, the type of haptic tactile feedback device disclosed in United States Patent Application Publication No. US 2015/0192995 A1. The present invention is also directed to the method of making arrays of these transducers.

SUMMARY OF THE INVENTION

The present invention is generally directed to a transducer comprising a transducer element including a plate defining a through-hole and a collar projecting from the plate and defining an interior cavity in communication with the through-hole, and a piezoelectric bender including at least first and second wafer layers stacked together, the piezoelectric bender being coupled to the transducer element in a relationship with a peripheral end face of the collar abutted against an exterior surface of one of the first and second wafer layers, whereby the first and/or second wafer layers are adapted to bend at a resonant frequency and generate ultrasonic waves flowing through the collar interior cavity and the plate through-hole and creating an in-air pressure pattern and in-air acoustic field at a location spaced from the transducer.

In one embodiment, the first and second wafer layers are made of different materials.

In one embodiment, the first and second wafer layers are both made of a piezoelectric material.

In one embodiment, the piezoelectric bender includes a third wafer layer sandwiched between the first and second wafer layers, the third wafer layer being made of a porous piezoelectric material.

In one embodiment, at least first and second electrically conductive through-hole vias extend through the piezoelectric bender.

The present invention is also directed to a transducer comprising a transducer element including a plate defining a through-hole and a collar defining an interior cavity in communication with the through-hole, and a piezoelectric bender including at least first and second wafer layers coupled together in a stacked relationship, the piezoelectric bender being coupled to the transducer element in a relationship with a peripheral end face of the collar of the transducer element abutting against an exterior surface of one of the first and second wafer layers, and at least first and second electrically conductive through-hole vias extending through the piezoelectric bender and in electrical coupling relationship with respective layers or conductive material on the respective first and second wafer layers, whereby the first and/or second wafer layers are adapted to bend at a resonant frequency and generate ultrasonic waves flowing through the collar interior cavity and the plate through-hole and creating an in-air pressure pattern and an in-air acoustic field at a location spaced from the transducer.

In one embodiment, each of the first and second wafer layers includes opposed exterior surfaces with first and second layers of conductive material and a third interior layer of conductive material and further comprising third and fourth electrically conductive through-hole vias, the first, second, third, and fourth through-hole vias extending through respective ones of the first and second wafer layers and in electrically coupling relationship with respective ones of the first, second, and third layers of conductive material.

The present invention is further directed to a transducer array comprising a plurality of transducers each comprising a transducer element including a plate defining a through-hole and a collar defining an interior cavity in communication with the through-hole, and a piezoelectric bender including at least first and second wafer layers disposed in a stacked relationship and at least first and second conductive through-hole vias, the piezoelectric bender being coupled to the transducer element in a relationship with a peripheral end face of the collar of the transducer element abutting against an exterior surface of one of the first and second wafer layers of the piezoelectric bender, whereby the first and/or second wafer layers of each of the piezoelectric benders of each of the plurality of transducers are adapted to bend at a resonant frequency and generate ultrasonic waves flowing through the collar interior cavity and the plate through-hole and creating an in-air pressure pattern and an in-air acoustic field at a location spaced from the transducer array.

The present invention is still further directed to a method of making a plurality of transducers comprising the steps of providing a monolithic transducer element structure including a plurality of transducer elements formed thereon and each including a plate defining a through-hole and a collar defining an interior cavity in communication with the through-hole, providing a piezoelectric bender, placing and coupling the piezoelectric bender against the monolithic transducer element structure in a relationship with the piezoelectric bender seated against the collar of the plurality of transducer elements, and cutting the monolithic transducer element structure to form and define the plurality of transducers.

In one embodiment, the step of providing a piezoelectric bender includes the step of providing a plurality of piezoelectric benders that are placed on and coupled to the plurality of transducer elements respectively.

In one embodiment, the step of providing a piezoelectric bender includes the step of providing a monolithic piezoelectric bender that is the size of the monolithic transducer element structure and placing and coupling the monolithic piezoelectric bender against the plurality of transducer elements on the monolithic transducer element structure.

There are other advantages and features of this invention, which will be more readily apparent from the following detailed description of the embodiments of the invention, the drawings, and the appended claims.

BRIEF DESCRIPTION OF THE FIGURES

In the accompanying drawings that form part of the specification, and in which like numerals are employed to designate like parts throughout the same.

DETAILED DESCRIPTION OF THE EMBODIMENTS

Figure 1:
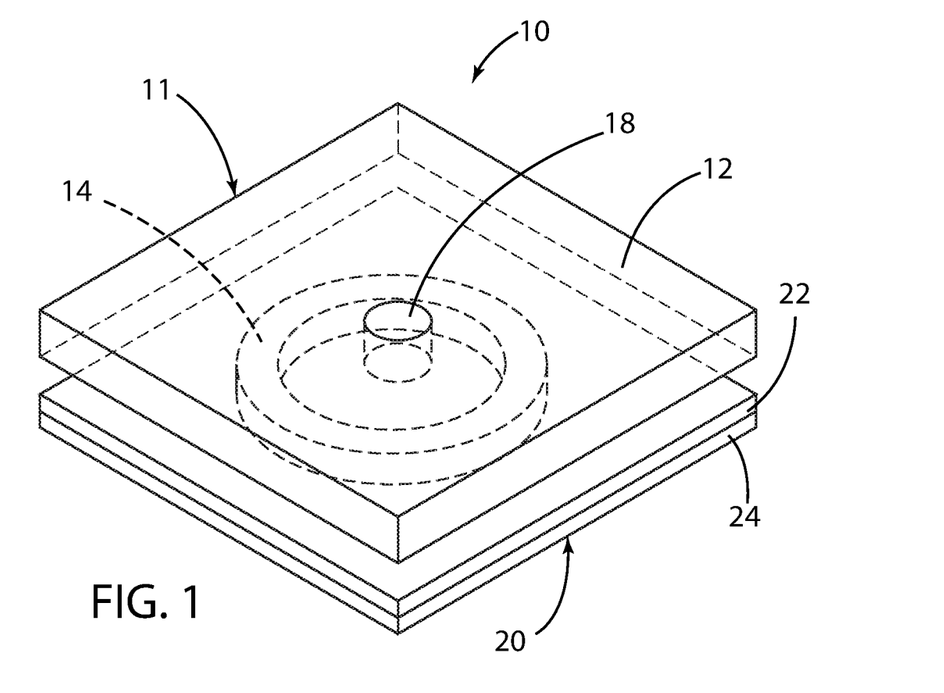
FIG. 1 is a perspective view of a transducer in accordance with the present invention.

FIG. 1 depicts a transducer 10 in accordance with the present invention.

Each individual resonator or transducer 10 may be a Helmholtz type resonator comprising a transducer member or element 11 including a flat elongate generally square shaped plate or top 12 and a circumferential generally cylindrical collar or neck 14 extending generally normally outwardly and downwardly from a bottom exterior surface of the plate or top 12.

In the embodiment shown, the collar or neck 14 forms a hollow tube of cylindrical cross-section extending and projecting generally normally outwardly and downwardly from the bottom exterior surface of the plate or top 12. The interior of the collar or neck 14 defines an interior generally cylindrically shaped cavity 16. An ultrasonic wave transmission through-hole 18 is defined in and extends generally centrally through the plate 12 in the region of the collar or neck 14 and, more specifically, in the region of the interior cavity 16 and, still more specifically, a through-hole 18 in open communication with and smaller in diameter than the interior cavity 16.

A piezoelectric transducer bender 20 is attached at or near the node for its resonant frequency to the transducer element 11 and, more specifically, is attached to a peripheral radial end face of the collar or neck 14 of the transducer element 11 using silicone, epoxy, or acrylic adhesive in a relationship with the piezoelectric bender device 20 spaced from and generally parallel to the plate 12.

In the embodiment shown, the transducer element 11 and, more specifically, the plate 12 and the collar or neck 14 thereof are both comprised of a plastic material such as ABS, Delrin, Nylon, polyethylene, PEEK, etc. The plate 12 and the collar or neck 14 may also be made of a metal material including, for example, steel, brass, aluminum, copper or other such metal or a ceramic material such as PZT, alumina, silica, etc. The plate 12 and the collar or neck 14 are ideally a single, monolithic structure but, as shown in FIG. 2, the collar or neck 14 can be a separate structure or element that is bonded to the exterior surface of the plate 12 using an epoxy or other adhesive.

Stated or described another way, the transducer 10 comprises a plate 12, a piezoelectric bender 20 spaced from and generally parallel to the plate 12, and a spacer collar or neck element or member 14 coupled and extending there between in a relationship generally normal to both the plate 12 and the bender 20 and together with the plate 11 and the piezoelectric bender 20 defining an interior cavity 16 between the plate 12 and the bender 20 which is in open communication with the through-hole 18 defined in the plate 11.

Figure 2:
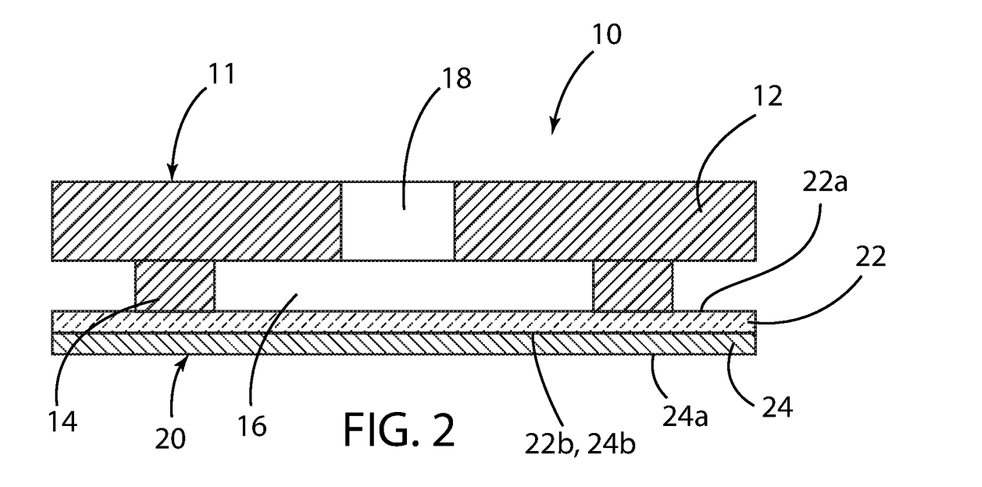
FIG. 2 is a vertical cross-sectional view of the transducer shown in FIG. 1.

In the embodiment of FIGS. 1 and 2, the piezoelectric bender 20 includes two separate wafer layers 22 and 24 coupled together in an overlying and stacked relationship with the top wafer 22 seated and coupled to the top exterior surface of the bottom wafer 24 and the bottom exterior radial end face of the collar 14 seated on and coupled to the top exterior surface of the top wafer layer 22.

In the embodiment shown, the first wafer layer 22 is an elongate generally flat layer or plate or wafer of piezoelectric material such as for example lead zirconate titanate (PZT), polycrystalline or single crystal lead magnesium niobate titanate (PMNT), barium titanate, or quartz. Further, in the embodiment shown, the second wafer layer 24 is an elongate generally flat layer or plate of steel, brass, steel alloy such as Alloy 42, copper, or other metal. The second wafer layer 24 may also be made of a plastic material such as polyethylene, ABS, Delrin, or Nylon, etc. or a ceramic material such as PZT, alumina, silica.

The first and second wafer layers 22 and 24 are bonded together in an overlying and abutting stacked relationship using an adhesive such as Loctite 312 acrylic adhesive or an epoxy. The x-y dimensions of the piezoelectric bender 20 are much greater than its thickness. For example, the bender 20 may be 5 mm by 5 mm by 0.150 mm thick.

In the embodiment of FIG. 2, the two opposing exterior surfaces 22a and 22b of the wafer layer 22 are covered with conductive material and the wafer layer 22 is polarized through its thickness. The piezoelectric wafer 22 is adapted to expand and contract in its planar direction when driven with a bipolar electric field. The expansion and contraction of the piezoelectric wafer 22 becomes constrained when the piezoelectric wafer 22 is bonded to another wafer that is made from a non-piezoelectric material such as for example the wafer layer 24, resulting in a bending motion.

Figure 3:
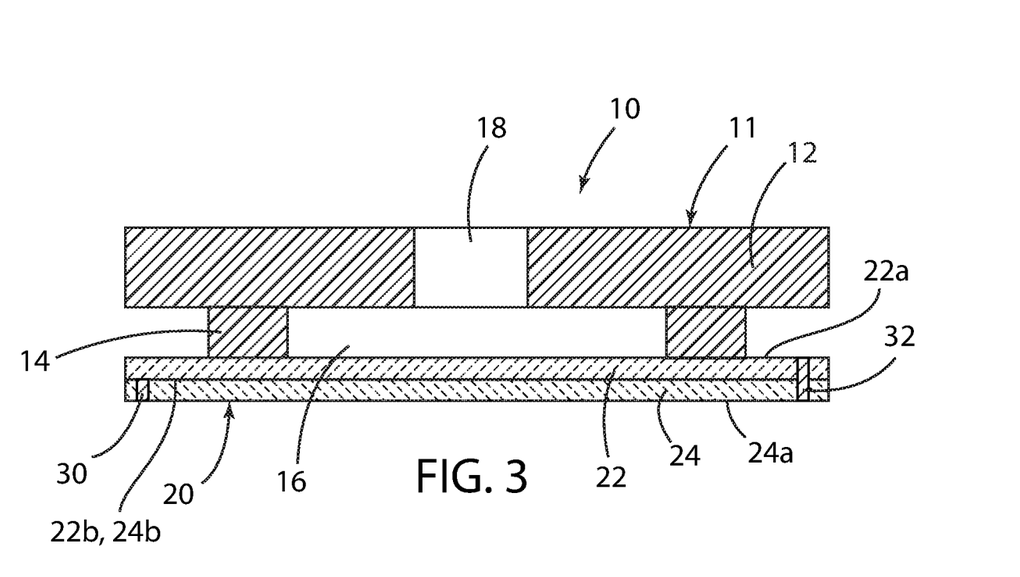
FIG. 3 is a vertical cross-sectional view of the transducer of FIG. 1 including another piezoelectric bender embodiment.

In another embodiment as shown in FIG. 3, both of the wafer layers 22 and 24 of the transducer bender 20 are comprised of a piezoelectric ceramic material such as PZT, PMNT, or barium titante. In this type of multilayer ceramic structure, at least one of the piezoelectric wafer layers 22 or 24 of the bender 20 is polarized through its thickness such that the polarized piezoelectric wafer layer 22 or 24 expands and contracts in the directions orthogonal to the polar direction when driven with a bipolar electric field causing the bender 20 to bend. Both layers 22 and 24 may be polarized, in which case they are driven with a bipolar electric field in a manner that one of the layers 22 or 24 of the bender 20 is expanding in its planar direction while the other layer 22 or 24 is contracting in order to create a bending motion.

In the embodiment of FIG. 3, the piezoelectric bender 20 includes and defines respective through-hole vias 30 and 32 filled with conductive material to provide electrical connection to the respective exterior electroded surfaces 22a and 24a of the respective layers 22 and 24.

In the embodiment of FIG. 3, the via 30 is located at one end of the piezoelectric bender 20, extends through the interior of the lower wafer layer 24 in a relationship generally normal to the exterior surface of the wafer layer 24, and terminates in a first opening in the exterior electroded bottom surface 24a of the wafer layer 24 and a second opening in the interior abutted electroded surfaces 22b and 24b of the respective wafer layers 22 and 24.

The via 32 is located at the opposite end of the piezoelectric bender 20 and extends through the interior of both of the wafer layers 22 and 24 and terminates in respective openings in the exterior electroded top surface 22a of the wafer layer 22 and the exterior electroded bottom surface 24a of the wafer layer 24.

Thus, in the embodiment of FIG. 3, via 30 extends only through the layer 24 while via 32 extends through both of the layers 30 and 32.

The conductive material in the through-hole via 30 is in electrical coupling relationship with the conductive material on the respective abutted interior surfaces 22b and 24b of the respective wafers 22 and 24 and not in electrical coupling relationship with the conductive material on the exterior surface 24a of the lower wafer layer 24.

The conductive material in the through-hole via 32 is in electrical coupling relationship with the conductive material on the top exterior surface 22a of the layer 22 and the bottom exterior surface 24a of the layer 24 and is not in electrical coupling relationship with the conductive material on the interior surfaces 22b and 24b of the wafer layers 22 and 24 respectively.

Figure 4:
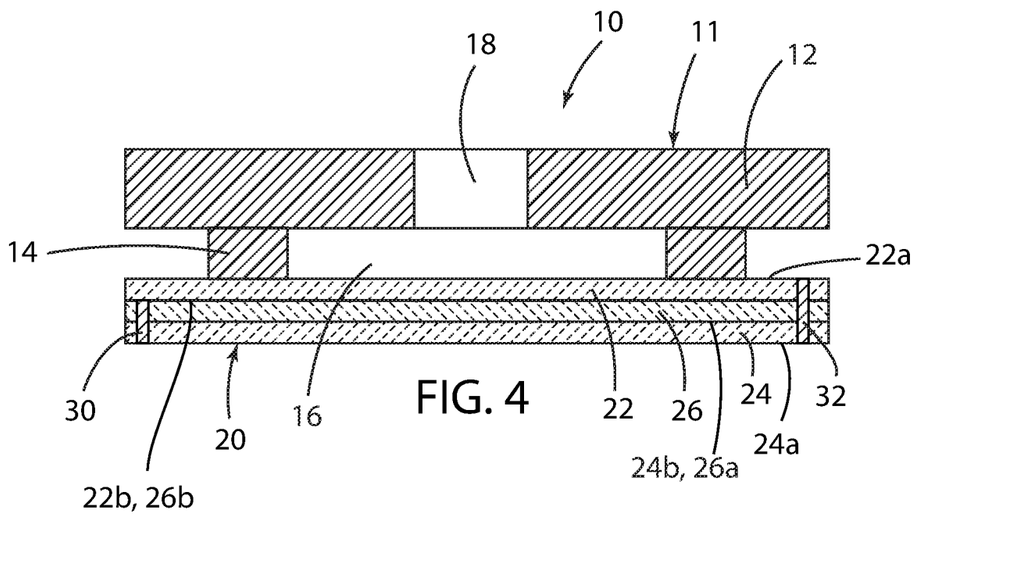
FIG. 4 is a vertical cross-sectional view of the transducer of FIG. 1 including yet another piezoelectric bender embodiment.

In another embodiment of a piezoelectric bender 20 as shown in FIG. 4, the bender 20 is comprised of a stack of three wafer layers 22, 24, and 26 with the wafer layer 26 comprising a flat center interior layer or plate of a non-poled porous piezoelectric material sandwiched between the top and bottom wafer layers 22 and 24 of piezoelectric material in which the top wafer layer 24 expands when driven with a bipolar electric field and the bottom wafer layer 22 contracts when driven with a bipolar electric field and vice versa.

In the piezoelectric bender embodiment 20 of FIG. 4, the via 30 is located at one end of the piezoelectric bender 20 and extends through both the interior of the bottom wafer layer 24 and the central interior wafer layer 26 and terminates in respective openings in the exterior electroded surface 24a of the bottom wafer layer 24 and the electroded interior surfaces 22b and 26b of the respective wafer layers 22 and 26.

The via 32 is located at the opposite end of the piezoelectric bender 20 and extends through the interior of the three wafer layers 22, 24, and 26 and terminates in respective openings in the exterior electroded exterior surfaces 22a and 24a of the top and bottom wafer layers 22 and 24 respectively.

More specifically, in the piezoelectric bender embodiment 20 of FIG. 4, the conductive material which fills the through-hole via 30 is in electrical coupling relationship with the conductive material that covers the exterior lower surface 24a of the wafer layer 24 and in electrical coupling relationship at the other opposed opening thereof with the conductive material that covers the respective interior surfaces 22b and 26b of the respective wafer layers 22 and 26.

The conductive material which fills the other opposed through-hole via 32 is in electrical coupling relationship with the conductive material on the interior surface 24b of the lower wafer layer 24 and the conductive material on the top exterior surface 22a of the upper wafer layer 22.

Thus, still more specifically, via 30 extends only through the layers 24 and 26 while via 32 extends through all three of the layers 24, 26, and 22.

Figure 5:
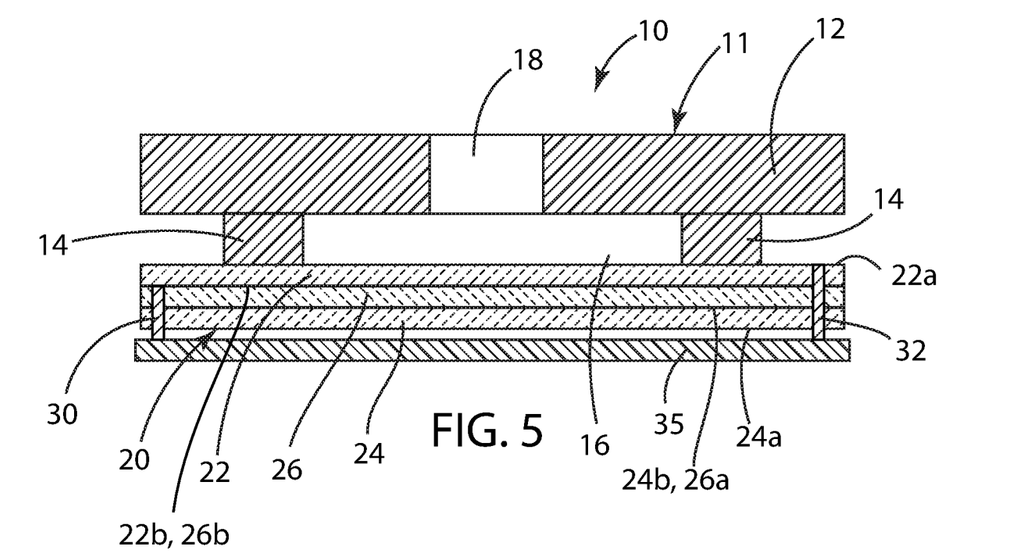
FIG. 5 is a vertical cross-sectional view of the transducer of FIG. 4 coupled to a base substrate.

FIG. 5 depicts the transducer 10 of FIG. 4 in which the piezoelectric bender 20 is coupled to a printed circuit board or substrate 35 in a relationship with the exterior electroded surface 24a of the bottom wafer 24 of the bender 20 opposed and parallel to the top exterior surface of the substrate 35 and, more specifically, in a relationship in which the conductive material which fills the respective conductive vias 30 and 32 is in electrical coupling relationship with the top exterior surface or face of the printed circuit board or substrate 35.

Thus, in all of the piezoelectric benders 20 previously described, the piezoelectric benders 20 may be multilayer stacks consisting of a plurality of layers 22 and 24 stacked together and electrically driven in parallel in order to reduce the required drive voltage. The layers 22 and 24 may be mechanically stacked and bonded together using an adhesive or they may be cofired, multilayer structures where the stack layers 22 and 24 are comprised of tape cast piezoelectric material printed with electrodes, laminated together, and cofired to form a monolithic structure. The vias 30 and 32 which are filled with electrically conductive material are used to complete the electrical connections to the internal 22b and external 22a and 24a electrodes eliminating the need for external connections such as tabs and wires.

Figure 6:
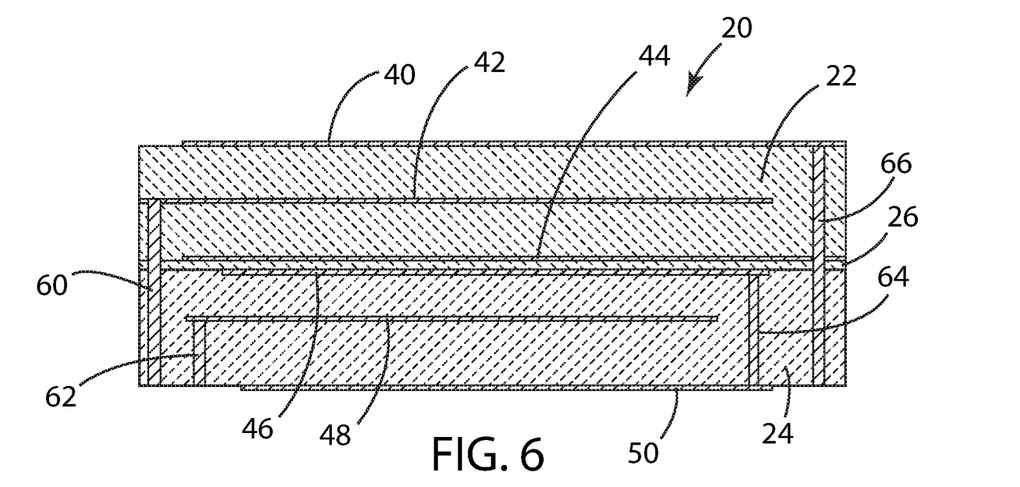
FIG. 6 is a vertical cross-sectional view of yet a further piezoelectric bender embodiment.

FIG. 6 is an embodiment of a piezoelectric bender 20 comprised of a multilayer stack of wafer layers 22, 24, and 26 including a central interior wafer layer 26 sandwiched between top and bottom wafer layers 22 and 24 which each include a plurality of electroded conductive layers as described in more detail below.

In the embodiment of FIG. 6, the wafer layer 22 includes layers 40, 42, and 44 of conductive material and the wafer layer 24 includes layers 46, 48, and 50 of conductive material.

The conductive layer 40 is located on and extends along the exterior top surface of the wafer layer 22. The conductive layer 44 is located on and extends along the interior bottom surface of the wafer layer 22 in a relationship sandwiched between the lower interior surface of the wafer layer 22 and the top interior surface of the central interior wafer layer 26. The additional layer 42 of conductive material is centrally located in and extends through the body of the wafer layer 22 in a relationship spaced and generally parallel to the upper and lower layers 40 and 44 of conductive material.

The conductive layer 46 is located on and extends along the interior top surface of the wafer layer 24. The conductive layer 50 is located on and extends along the lower exterior surface of the wafer layer 24. The additional layer 48 of of conductive material is centrally located in and extends through the body of the wafer layer 24 in a relationship spaced and generally parallel to the upper and lower layers 46 and 50 of conductive material.

In the embodiment of FIG. 6, the piezoelectric bender 20 includes and defines four electrically conductive vias 60, 62, 64, and 66. The via 60 is located at one end of the bender 20, extends through the interior of the layers 22 and 24 and terminates at one end in an opening defined in the bottom exterior surface of the layer 24 and at the other end in the layer 42 of conductive material extending through the body of the wafer layer 22.

The via 62 is located adjacent to and spaced from and to the interior of the via 60 and terminates at one end in an opening defined in the bottom exterior surface of the layer 24 and at the other end in the layer 48 of conductive material extending through the body of the wafer layer 24.

The via 66 is located at the other end of the bender 20, extends through the interior of the layers 22 and 24 and terminates at one end in an opening defined in the bottom exterior surface of the layer 24 and terminates at the other end in the layer 40 of conductive material located on the top exterior surface of the layer 22.

The via 64 is located adjacent and spaced from and to the interior of the via 64, extends through the interior of the layer 24 and terminates at one end in an opening defined in the bottom exterior surface of the layer 24 and terminates at the other end in the layer 46 of conductive material extending along the top interior surface of the layer 24.

Thus, in the embodiment of FIG. 6, via 60 extends through the layers 24 and 26 and a portion of the layer 22; via 62 extends only through portion of the interior of the layer 24; via 64 extends through the layer 24; and via 66 extends through all of the layers 24, 26, and 22.

Thus, in the embodiment of FIG. 6, the wafer layer 22 is polarized for bending action through the conductive vias 60 and 66 and the conductive layers 40, 42, and 44 electrically coupled to the vias 60 and 66 as described above. The wafer layer 24 is polarized for bending action through the conductive vias 62 and 64 and the conductive layers 46, 48, and 50 electrically coupled to the vias 62 and 64 as described above.

Referring back to FIGS. 1-5, it is understood that the combination of the volume or area of the neck or collar cavity 16, the thickness of the plate 12, and the diameter of the plate through-hole 18 define the resonant frequency for the transducer 10. The dimensions and materials of the piezoelectric bender 20 determine the resonant frequency of the piezoelectric bender 20. In one embodiment, the transducer element cavity 16 and piezoelectric bender 20 are designed to have similar, but not necessarily equivalent, resonant frequencies.

In one preferred embodiment, the transducer 10 has a resonant frequency between 20 and 100 kHz, preferably in the 40 to 80 kHz for generating a sound pressure level (SPL) at 30 cm greater than 100 dB, preferably greater than 120 dB, most preferably greater than 125 dB at a drive voltage below 50 V, preferably below 20 volts when referenced to a pressure of 20 micropascals. The array has high directivity, preferably with a beam pattern less than eighty (80) degrees.

In one preferred embodiment, the transducer 10 includes a transducer element 11 with a plate 12 and a neck or collar 14 made of polyether ether ketone (PEEK), the transducer 10 has an overall height of approximately 1 mm, the neck or collar 14, and thus the interior cavity 16, has an interior diameter of 2.75 mm, an outside diameter of 3.75 mm, a neck or collar 14 height of 0.35 mm, a plate 12 thickness of 0.5 mm, and a through-hole 18 diameter of 0.715 mm. The bender 20 is 5 mm by 5 mm and has a layer of CTS 3195STD PZT 0.153 mm thick bonded to a stainless steel layer 0.153 mm thick to generate a resonant frequency in the 40 to 55 kHz range a SPL of 125 dB when driven with less than 20 volts.

In accordance with the present invention, the bending of the layers 22 and/or 24 of the bender 20 generates ultrasonic pressure waves in the interior cavity 16 of the neck 14 of the transducer element 11 which flow and pass through the ultrasonic wave transmission through-hole 18 in the plate 12 of the transducer element 11 and then outwardly away from the transducer 10 in a predetermined air pressure pattern and direction defining and forming a predetermined in-air acoustic field at a predetermined location above and spaced from the transducer 10.

In accordance with the present invention, the use of a transducer 10 that includes a transmission through-hole 18 in communication with an interior transducer cavity 16 advantageously enhances and improves the pressure, spread, and direction of the ultrasonic waves generated and transmitted outwardly from the transducer 10.

In accordance with the present invention, the dimensions and sizes of the plate 12 and the through-hole 18 defined therein and the neck 14 and the interior cavity 16 determine the characteristics of the air pressure pattern and in-air acoustic field including for example, the magnitude, direction, configuration, size, and location of the air pressure pattern and in-air acoustic field for generation of a predetermined tactile sensation on for example the fingers of a user.

Figure 7:
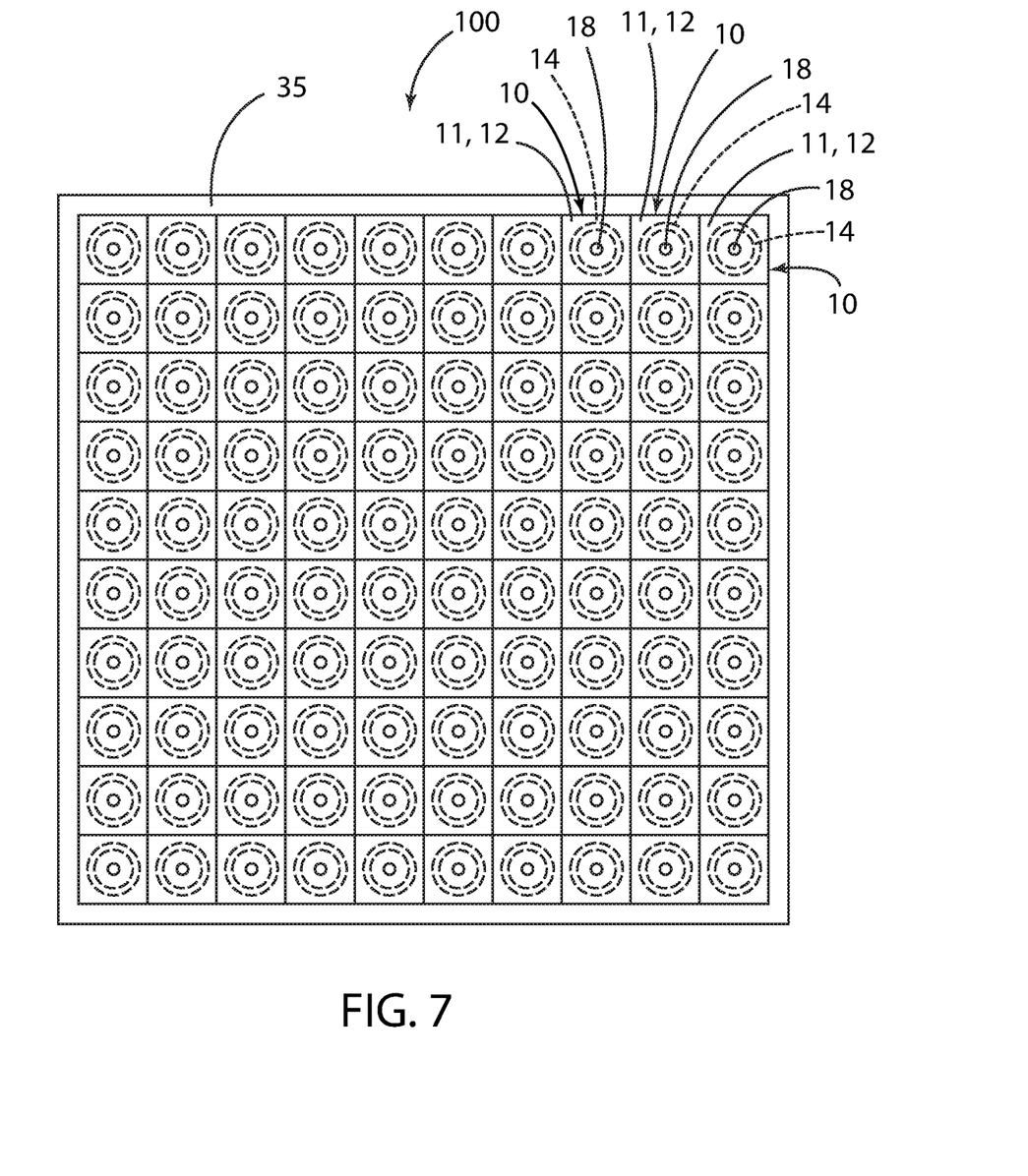
FIG. 7 is a simplified top plan view, partly in phantom, of an array of the transducers in accordance with the present invention.

In one embodiment, a two dimensional quadrant array of transducers 10 such as, for example, the transducer array 100 shown in FIG. 7, may be formed by connecting or bonding a plurality of individual and separate transducers 10 of the type shown in for example FIGS. 1-5 (only three of which have been labeled with numerals in FIG. 7) on the substrate or circuit board 35 in a relationship with the bender 20 of the transducers 10 shown in FIGS. 1-5 and, more specifically, the lower exterior surface 24a of the lower wafer layer 24 of the bender 20 of the transducers 10 shown in FIGS. 1-5, seated against the top exterior surface of the substrate 35. The connection between the individual transducer elements 11 is between 0.25 and 1 mm. In the embodiment shown, the array 100 is a ten by ten array including ten rows and ten columns of transducers 10.

In accordance with the present invention, the bending of the layers 22 and/or 24 of the separate benders 20 of the plurality of transducers 10 in the transducer array 100 generates ultrasonic pressure waves which flow and pass through the ultrasonic wave transmission through-hole 18 in the plate 12 of the transducer element 11 of the plurality of transducers 10 and then outwardly away from the plurality of transducers 10 in a plurality of predetermined air pressure patterns and directions relative to each other to define and form a predetermined in-air acoustic field at a predetermined location above and spaced from the transducers 10.

Figure 8:
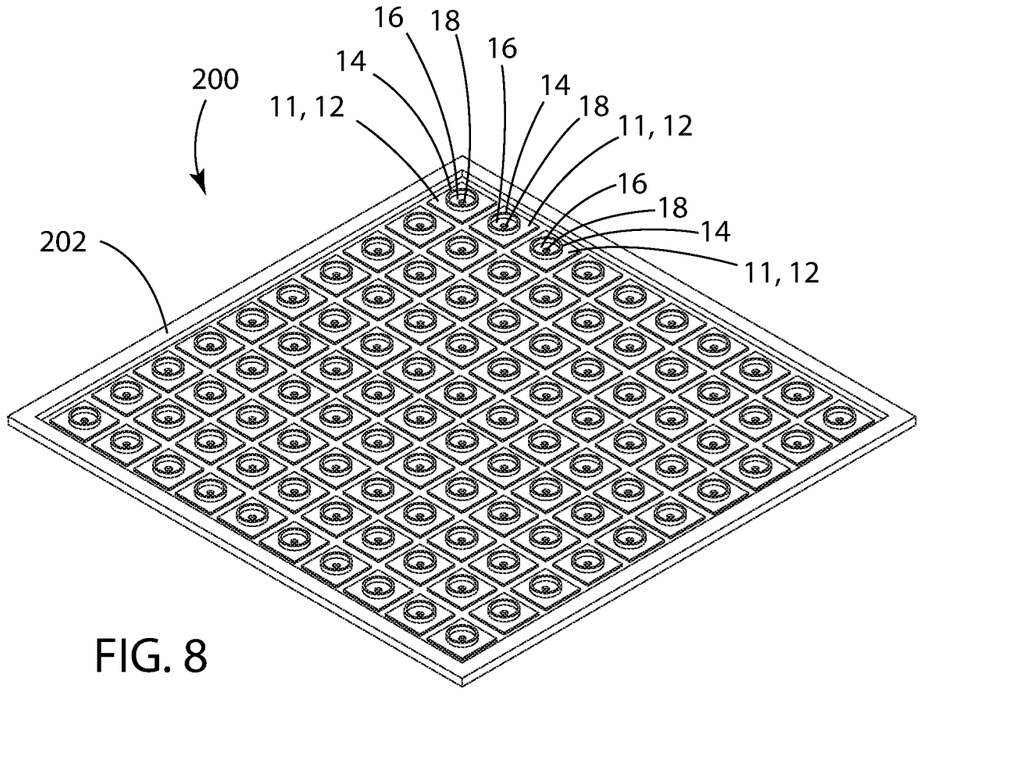
FIG. 8 is a perspective view of one embodiment of a monolithic structure comprising a plurality of first transducer elements.

Alternatively, as shown in FIG. 8, the transducer array 100 may be formed by a method which includes initially forming and providing a monolithic or unitary transducer element structure 200 including an array of a plurality of transducer elements 11 (only three of which have been labeled with numerals in FIG. 8) molded, machined, or three dimensionally printed in a unitary relationship on a support or forming backing plate 202. Each of the plurality of transducer elements 11 corresponds to the transducer element 11 of the transducers 10 shown in FIGS. 1-5 and described above and including a plate 12, a collar 14 defining an interior cavity 16, and a through-hole 18 in the plate 12. In the embodiment of FIG. 8, the array 200 is a ten by ten array including ten rows and ten columns of unitary transducer elements 11 formed on the plate 202.

Thereafter, and although not shown in any of the FIGS., it is understood that a plurality of individual benders 20 of the type shown in for example FIGS. 1-5 and described above are seated over and coupled to the collar 14 of each of the transducer elements 11 on the plate 202 to define and form a plurality of transducers 10 on the plate 202.

Alternatively, a monolithic or unitary bender 20 of the type shown in for example FIGS. 1-5 and described above and having the size of the plate 202 is formed, seated, and coupled to the top of the plate 202 in a relationship overlying and abutting against the plurality of transducer elements 11 and, more specifically, in a relationship overlying and abutted against the plurality of collars 14 thereof.

Thereafter, the plate 202 is cut to form and define a plurality of individual and separate transducers 10 of the type shown in for example FIGS. 1-5 and described above which would then be seated and coupled to a substrate 35 to form and define the transducer array 100 shown in FIG. 7 and described above.

Numerous variations and modifications of the transducer 20, the transducer array 100, the monolithic structure 220, and method of making the same in accordance with the present invention may be effected without departing from the spirit and scope of the novel features of the invention.

It is also to be understood that no limitations with respect to the embodiments illustrated herein are intended or should be inferred. It is, of course, intended to cover by the appended claims all such modifications as fall within the scope of the claims.

We claim:

1. A transducer comprising:
    a transducer element including a plate defining a through-hole;
    a piezoelectric bender including at least first and second wafer layers stacked together; and
    a circumferentially extending collar positioned between the plate of the transducer element and the piezoelectric bender in a relationship with a first peripheral end face of the collar abutted against an exterior surface of one of the first and second wafer layers of the piezoelectric bender and a second opposed peripheral end face of the collar abutted against an exterior surface of the plate of the transducer element with the circumferentially extending collar surrounding the through-hole defined in the plate of the transducer element and the collar defining a closed interior cavity between the plate of the transducer element and the piezoelectric bender in communication with the through-hole defined in the plate of the transducer element;
    whereby the first and/or second wafer layers are adapted to bend at a resonant frequency and generate ultrasonic waves flowing from the first and/or second wafer layers through the closed collar interior cavity and through the plate through-hole and create an in-air pressure pattern and in-air acoustic field at a location spaced from the transducer.

2. The transducer of claim 1, wherein the first and second wafer layers are made of different materials.

3. The transducer of claim 1, wherein the first and second wafer layers are both made of a piezoelectric material.

4. A transducer comprising:
    a transducer element including a plate defining a through-hole and a collar projecting from the plate and defining an interior cavity in communication with the through-hole; and
    a piezoelectric bender including at least first and second wafer layers stacked together, the piezoelectric bender being coupled to the transducer element in a relationship with a peripheral end face of the collar abutted against an exterior surface of one of the first and second wafer layers;
    whereby the first and/or second wafer layers are adapted to bend at a resonant frequency and generate ultrasonic waves flowing through the collar interior cavity and the plate through-hole and create an in-air pressure pattern and in-air acoustic field at a location spaced from the transducer, and
    the piezoelectric bender includes a third wafer layer sandwiched between the first and second wafer layers, the third wafer layer being made of a porous piezoelectric material.

5. A transducer comprising:
    a transducer element including a plate defining a through-hole and a collar projecting from the plate and defining an interior cavity in communication with the through-hole; and
    a piezoelectric bender including at least first and second wafer layers stacked together, the piezoelectric bender being coupled to the transducer element in a relationship with a peripheral end face of the collar abutted against an exterior surface of one of the first and second wafer layers;
    whereby the first and/or second wafer layers are adapted to bend at a resonant frequency and generate ultrasonic waves flowing through the collar interior cavity and the plate through-hole and create an in-air pressure pattern and in-air acoustic field at a location spaced from the transducer, and
    further comprising at least first and second electrically conductive through-hole vias extending through the piezoelectric bender,
    each of the first and second wafer layers including opposed exterior surfaces with first and second layers of conductive material and a third interior layer of conductive material and further comprising third and fourth electrically conductive through-hole vias, the first, second, third, and fourth through-hole vias extending through respective ones of the first and second wafer layers and in electrically coupling relationship with respective ones of the first, second, and third layers of conductive material.

6. A transducer array comprising a plurality of transducers each comprising:
    a transducer element including a plate defining a through-hole;
    a piezoelectric bender including at least first and second wafer layers disposed in a stacked relationship and at least first and second conductive through-hole vias; and
    a circumferentially extending collar positioned between the plate of the transducer element and the piezoelectric bender in a relationship with a first peripheral end face of the collar of the transducer element abutting against an exterior surface of one of the first and second wafer layers of the piezoelectric bender and a second opposed peripheral end face of the collar abutted against an exterior surface of the plate of the transducer element with the circumferentially extending collar surrounding the through-hole defined in the plate of the transducer element and the collar defining a closed interior cavity between the plate of the transducer element and the piezoelectric bender in communication with the through-hole defined in the plate of the transducer element;
    whereby the first and/or second wafer layers of each of the piezoelectric benders of each of the plurality of transducers are adapted to bend at a resonant frequency and generate ultrasonic waves flowing from the first and/or second wafer layers through the collar interior cavity and through the plate through-hole and creating an in-air pressure pattern and an in-air acoustic field at a location spaced from the transducer array.

* * * * *